(12) United States Patent
Chen et al.

(10) Patent No.: US 9,865,477 B2
(45) Date of Patent: Jan. 9, 2018

(54) BACKSIDE POLISHER WITH DRY FRONTSIDE DESIGN AND METHOD USING THE SAME

(71) Applicant: Taiwan Semiconductor Manufacturing Co., Ltd., Hsin-Chu (TW)

(72) Inventors: Chih-Hung Chen, Hsin-Chu (TW); Chia-Jung Hsu, Changhua County (TW); Yi-An Lin, Taipei (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 135 days.

(21) Appl. No.: 15/052,310

(22) Filed: Feb. 24, 2016

(65) Prior Publication Data

US 2017/0243733 A1 Aug. 24, 2017

(51) Int. Cl.
*H01L 21/321* (2006.01)
*H01L 21/02* (2006.01)
*H01L 21/683* (2006.01)
*H01L 21/673* (2006.01)

(52) U.S. Cl.
CPC .... *H01L 21/32115* (2013.01); *H01L 21/0209* (2013.01); *H01L 21/02013* (2013.01); *H01L 21/02016* (2013.01); *H01L 21/02054* (2013.01); *H01L 21/3212* (2013.01); *H01L 21/673* (2013.01); *H01L 21/683* (2013.01)

(58) Field of Classification Search
CPC ............... H01L 21/683; H01L 21/673; H01L 21/02016; H01L 21/02013; H01L 21/02054; H01L 21/0209; H01L 21/3212; H01L 21/32115
See application file for complete search history.

(56) References Cited

U.S. PATENT DOCUMENTS

| | | | |
|---|---|---|---|
| 6,276,998 B1* | 8/2001 | Sommer | B24B 37/32 257/E21.23 |
| 8,518,741 B1* | 8/2013 | Lu | H01L 25/0657 438/106 |
| 2007/0270080 A1* | 11/2007 | Barada | B24B 37/30 451/5 |
| 2008/0268753 A1* | 10/2008 | Ishikawa | B24B 37/30 451/36 |
| 2011/0053062 A1* | 3/2011 | Shibazaki | G03F 7/70725 430/30 |
| 2011/0159783 A1* | 6/2011 | Fukushima | B24B 37/042 451/11 |
| 2017/0136602 A1* | 5/2017 | Hou | B24B 37/20 |

* cited by examiner

*Primary Examiner* — Joseph C Nicely
(74) *Attorney, Agent, or Firm* — Haynes and Boone, LLP

(57) ABSTRACT

The present disclosure provides a semiconductor fabrication apparatus in accordance with one embodiment. The apparatus includes a wafer stage that is operable to secure and rotate a wafer; a polish head configured to polish a backside surface of the wafer; an air bearing module configured to apply an air pressure to a front surface of the wafer; and an edge sealing unit configured to seal edges of the wafer.

20 Claims, 11 Drawing Sheets

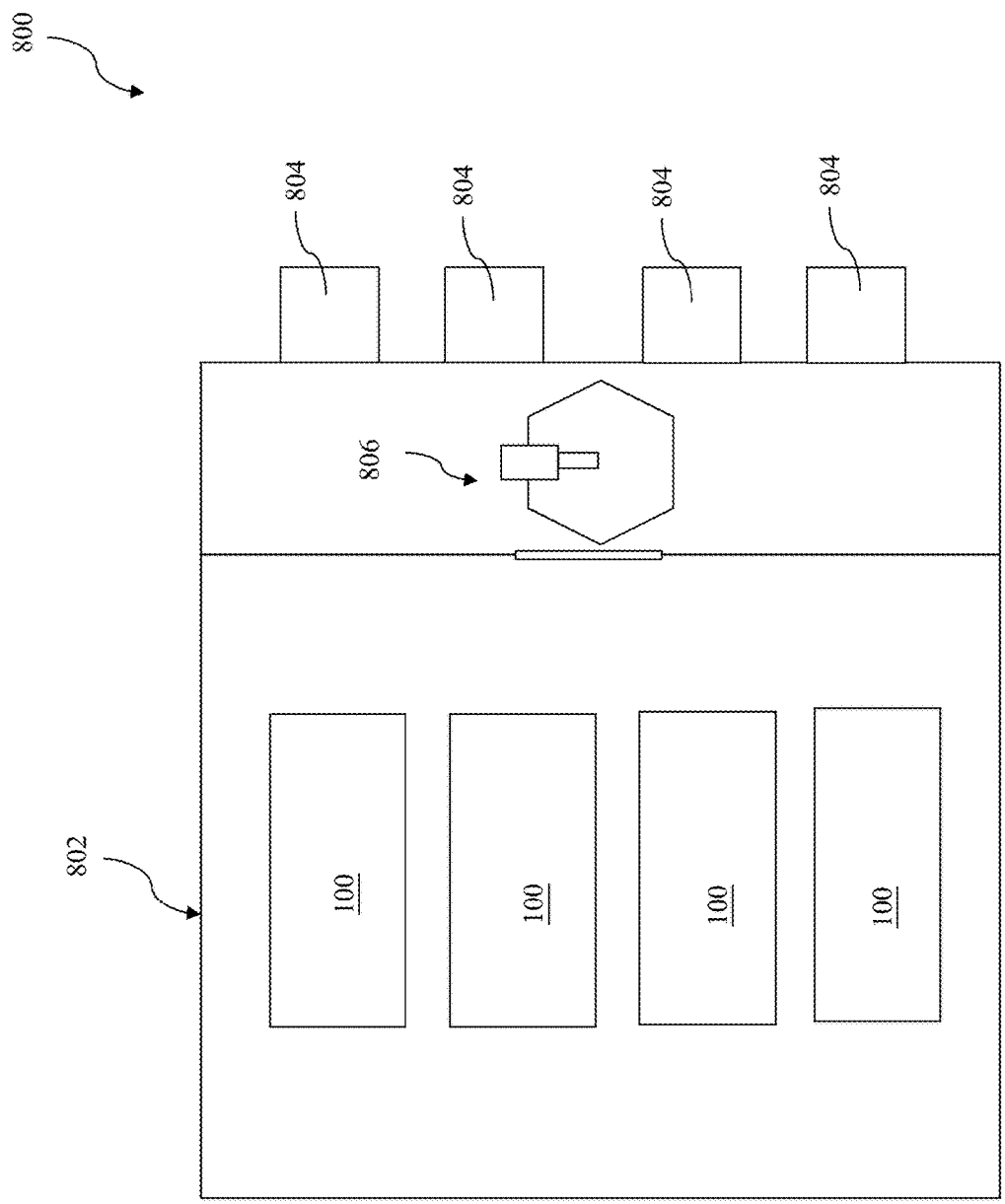

BACKSIDE POLISHER WITH DRY FRONTSIDE DESIGN AND METHOD USING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed. In one example, polishing is applied to semiconductor wafer. However, the existing polish systems and the corresponding methods are not effective and may introduce additional issues, such as contaminations and damages to the wafer. Accordingly, it would be desirable to provide a polish system and a method of utilizing thereof absent the disadvantages discussed above.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussions.

FIG. 8 is a block diagram of a polish system having a polish module of FIG. 1, constructed in accordance with some embodiments.

DETAILED DESCRIPTION

Figure 1:
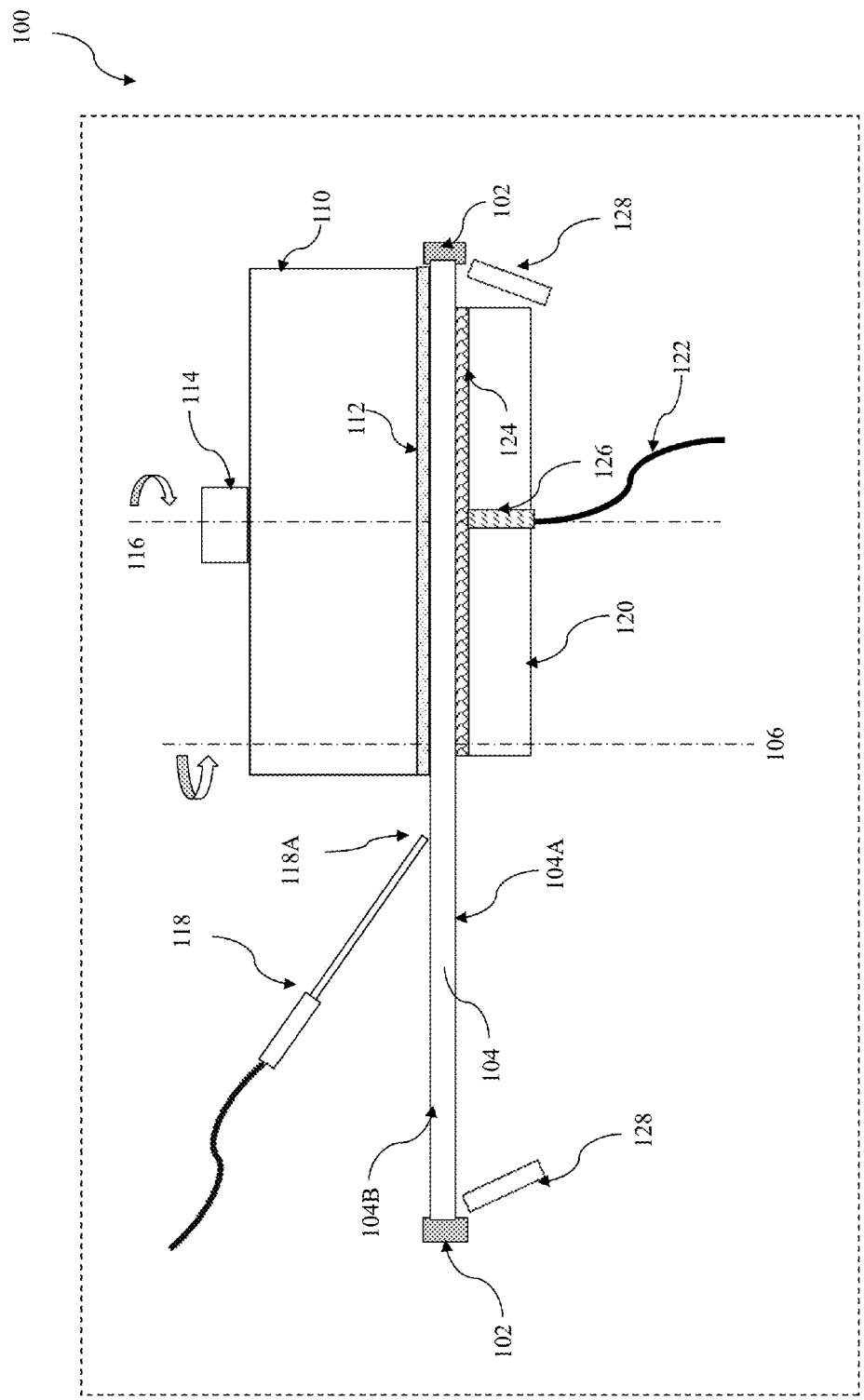
FIG. 1 is a schematic and sectional view of a polish module constructed in accordance with some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 illustrates a schematic and sectional view of a polish module 100 in accordance with some embodiments. The polish module 100 includes a substrate stage 102 designed to secure a semiconductor wafer 104 and having a mechanism to rotate the wafer 104 around an axis 106, which is perpendicular to the wafer 104 and passes its center. For examples, the substrate stage 102 may include clamping structure to secure the edges of the semiconductor wafer 104. In other examples, the substrate stage 102 further includes a rotation structure and a motor integrated to enable the rotation of the semiconductor wafer 104.

In some embodiments, the semiconductor wafer 104 is a silicon wafer. In some embodiments, the semiconductor wafer 104 may include an elementary semiconductor, such as germanium in a crystalline structure; a compound semiconductor, such as silicon germanium, silicon carbide, gallium arsenic, gallium phosphide, indium phosphide, indium arsenide, and/or indium antimonide; or combinations thereof. In furtherance of the embodiments, those semiconductor material films may be epitaxially grown on the silicon wafer. In some other embodiments, the wafer 104 may be a substrate of other material.

The semiconductor wafer 104 has a front surface 104A and a backside surface 104B opposing from each other. One or more integrated circuits are formed, partially formed or to-be formed on the front surface 104A of the semiconductor wafer 104. Therefore, the front surface 104A of the semiconductor wafer 104 includes a patterned material layer or a material layer to be patterned. For examples, the front surface 104A may include various isolation features (such as shallow trench isolation features), various doped features (such as doped wells, or doped source and drain features), various devices (such as transistors), various conductive features (such as contacts, metal lines and/or vias of an interconnection structure), packaging material layers (such as bonding pads and/or a passivation layer), or a combination thereof. On a completely fabricated semiconductor wafer, all above material layers and patterns may present on the front surface 104A of the semiconductor wafer 104. In the present example, the semiconductor wafer 104 is still in the fabrication, a subset of the above material layers may be formed on the front surface 104A.

The polish module 100 includes a polish head 110 configured to polish the backside surface 104B of the semiconductor wafer 104. The polish head 110 includes a polish surface 112, such as an abrasive tape or other suitable polish surface. The polish surface may further include other structure, such as a roll that is operable to roll on the wafer and clean the wafer accordingly.

The polish module 100 further includes a mechanism 114 that is operable to apply a pressure to the wafer through the polish surface 112 and is operable to rotate the polish head around a rotation axis 116. The rotation axis 116 is parallel with the rotation axis 106 and passes through the center of the polish surface 112. Thus, the polish surface 112 is able to be pressed on the backside surface 104B of the wafer 104 and to rotate relative to the wafer 104.

In some embodiments, the polish module 110 also includes a rinsing unit 118 configured to rinse the backside surface of the wafer 104 with a solution or a chemical. In the present embodiments, the rinsing unit 118 is movable for efficient cleaning effect or support the polishing process. For example, the rinsing unit 118 is movable from the center to the edges of the wafer or from the edges to the center. The rinsing unit 118 includes a rinsing tip 118A pointing at the backside surface 104A and coupled to a source (not shown) that supplies rinsing chemical or solution. The rinsing unit 118 and the polish head 110 are operable to synergistically work together during a polishing process.

The polish module 100 includes an air bearing unit 120 designed to provide an air pressure to the front surface 104A of the wafer 104. The air bearing unit 120 provides an air pressure to the front surface 104A of the wafer 104 so that the wafer 104 is maintained with the backside pressure from the polish head 110 and the front pressure from the air bearing unit 120. The air bearing unit 120 provides an advantages that include no direct contact and friction force between the bearing surface and the front surface 104A of the wafer. Especially, considering that the front surface 104A has circuit patterns and the wafer 104 spins during the polishing process, any damage to the circuit patterns on the front surface 104A is eliminated.

The air bearing unit 120 is an aerostatic bearing. The air bearing unit 120 is connected to a gas source 122, such as nitrogen source. In the present embodiment, the gas source 122 is a compressed nitrogen source that delivers nitrogen with a pressure higher than the atmospheric pressure. The air bearing unit 120 includes a bearing surface 124 to deliver the gas to a bearing gap between the bearing surface 124 and the front surface 104A of the wafer 104, thereby forming a fluid film between the bearing surface 124 and the front surface 104A as an air cushion. The air bearing unit 120 further includes a gas path 126 that connects the gas source 122 and the bearing surface 124 for gas delivery. In some embodiments, the bearing surface 124 includes a porous material layer, such as a porous membrane or graphite, so that the gas is uniformly delivered to the bearing gap. In some embodiments, the bearing surface 124 includes a material layer with a plurality of micro nozzles designed to uniformly deliver the gas to the bearing gap. The air pressure in the bearing gap is able to be self-adjusted during the polishing process.

For example, when the gas pressure is higher, the bearing gap is increased, causing the gas flow rate being increased. Accordingly, the gas pressure is decreased through this self-adjustment mechanism. In various examples, the air bearing unit 120 may include other features, such as channels or groves on the bearing surface 124.

The air bearing unit 120 is integrated with the polish head 110. In the present embodiment, the air bearing unit 120 is mechanically connected with the polish head 110 so that the air bearing unit 120 is secured to the polish head 110 and is able to move along with the polish head 110. This will be further described in details later.

Figure 2:
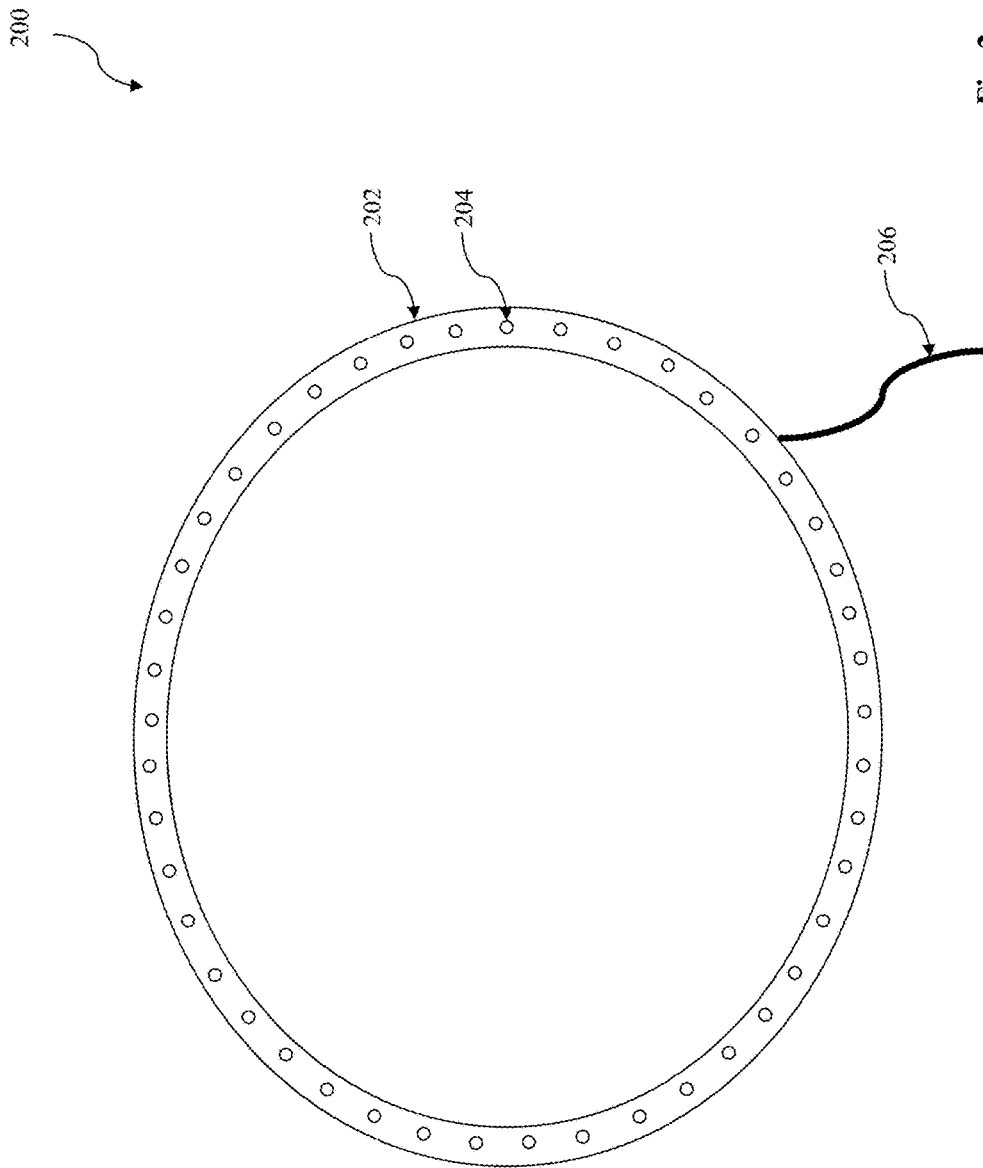
FIG. 2 is a schematic view of an edge sealing unit of the polish module in FIG. 1, constructed in accordance with some embodiments.
Figure 3:
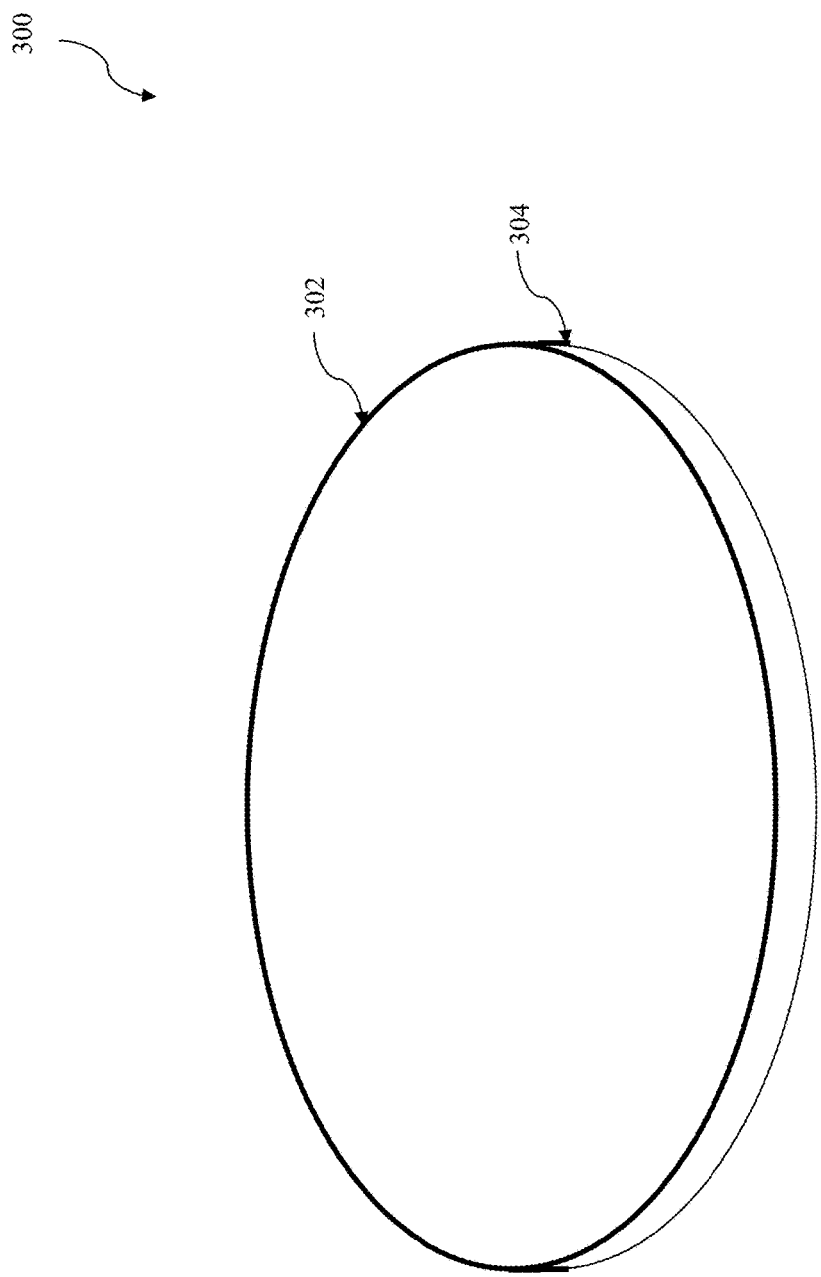
FIG. 3 is a schematic view of an edge sealing unit of the polish module in FIG. 1, constructed in accordance with some embodiments.

The polish module 100 further includes an edge sealing unit 128 designed to seal the edges of wafer 104 such that chemical or solution from the backside surface 104B of the wafer 104 cannot reach the front surface 104A, therefor eliminating the contaminating to the front surface 104A. In some embodiments, the edge sealing unit 128 is an air sealing unit 200 that is operable to form an air curtain around the edges of the wafer 104 for effective sealing. In some examples, the air sealing mechanism 200 includes a plurality of air nozzles configured in a ring to form a ring air curtain aligned with the edges of the wafer 104. In some embodiments, as illustrated in FIG. 2 in a schematic view, the air sealing mechanism 200 includes a ring pipe 202 with a plurality of openings 204. The ring pipe 202 matches the edges of the wafer 104. The ring pipe 202 is also connected to a gas source 206 for delivering a pressured gas, such as nitrogen. The openings 204 are formed on the ring pipe 200 with a configuration to generate an air curtain that effectively protects the front surface 104A of the wafer 104 from contamination by the chemical or solution used to polish or clean the backside surface 104B. In some other embodiments, the edge sealing unit 128 is an O-ring sealing unit 300. The O-ring sealing unit 300 includes an O-ring 302 with a vertically extended edge curtain 304 to prevent the chemical or solution from contaminating the front surface 104A of the wafer 104, as illustrated in FIG. 3 in a schematic view.

The edge sealing unit 128 is integrated with a component (such as wafer stage) of the polish module 100 or a fixture such that the edge sealing unit 128 is secured and is able to effectively seal the edge of wafer 104 without interfering the motions of wafer 104 during various operations. This will be further described in details later.

Figure 4:
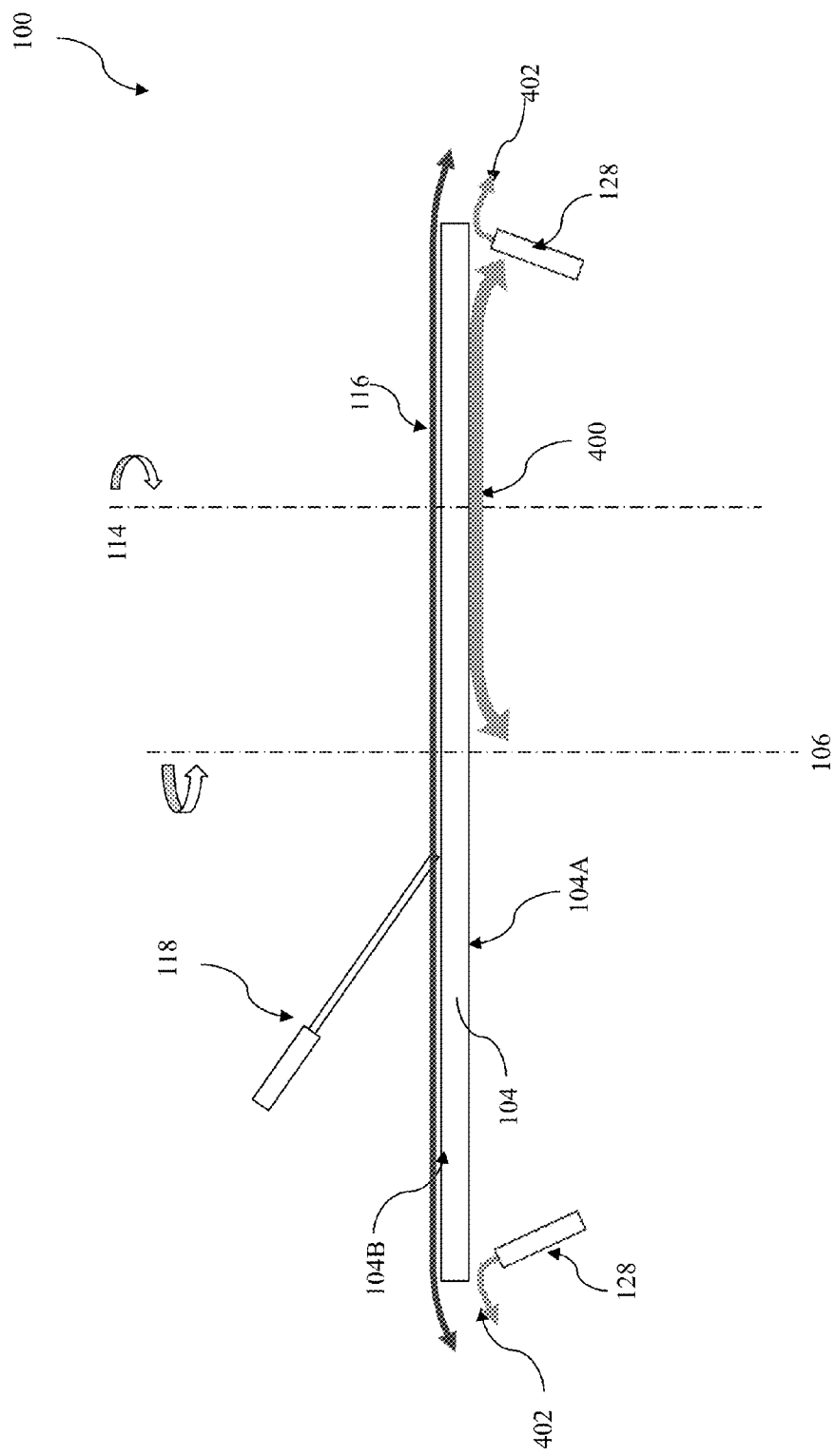
FIG. 4 is a schematic and sectional view of the polish module of FIG. 1, in portion, constructed in accordance with some embodiments.

FIG. 4 is a schematic and sectional view of the polish module 100 in portion, in accordance with some embodiments. By utilizing the air bearing unit 120, a fluid film 400, such as nitrogen film, is formed between the front surface 104A of the wafer 104 and the bearing surface 124 of the air bearing unit 120. There is no direct contact between the air bearing unit 120 and the front surface 104A of the wafer 104 during a polishing process. Therefore, the damage to the front surface 104A is eliminated. Furthermore, by utilizing the edge sealing unit 128, the edge sealing feature 402 is formed to effectively prevent the front surface 104A from contamination by the chemical or solution from the backside surface 104B. In the present embodiment, the edge sealing feature 402 is an air edge sealing feature, such as nitrogen knife to effectively defend the front surface 104A. In some embodiments, the edge sealing feature 42 is an O-ring structure, such as the one illustrated in FIG. 3. The air bearing unit 120 and the edge sealing unit 128 collectively protect the front surface 104A of the wafer 104 during a polishing process. Additionally, since the front surface 104A is not contaminated during the polishing process, various cleaning measures for the front surface 104A may be eliminated. Accordingly, the manufacturing cost is decreased and the manufacturing throughput is increased.

Figure 5A:
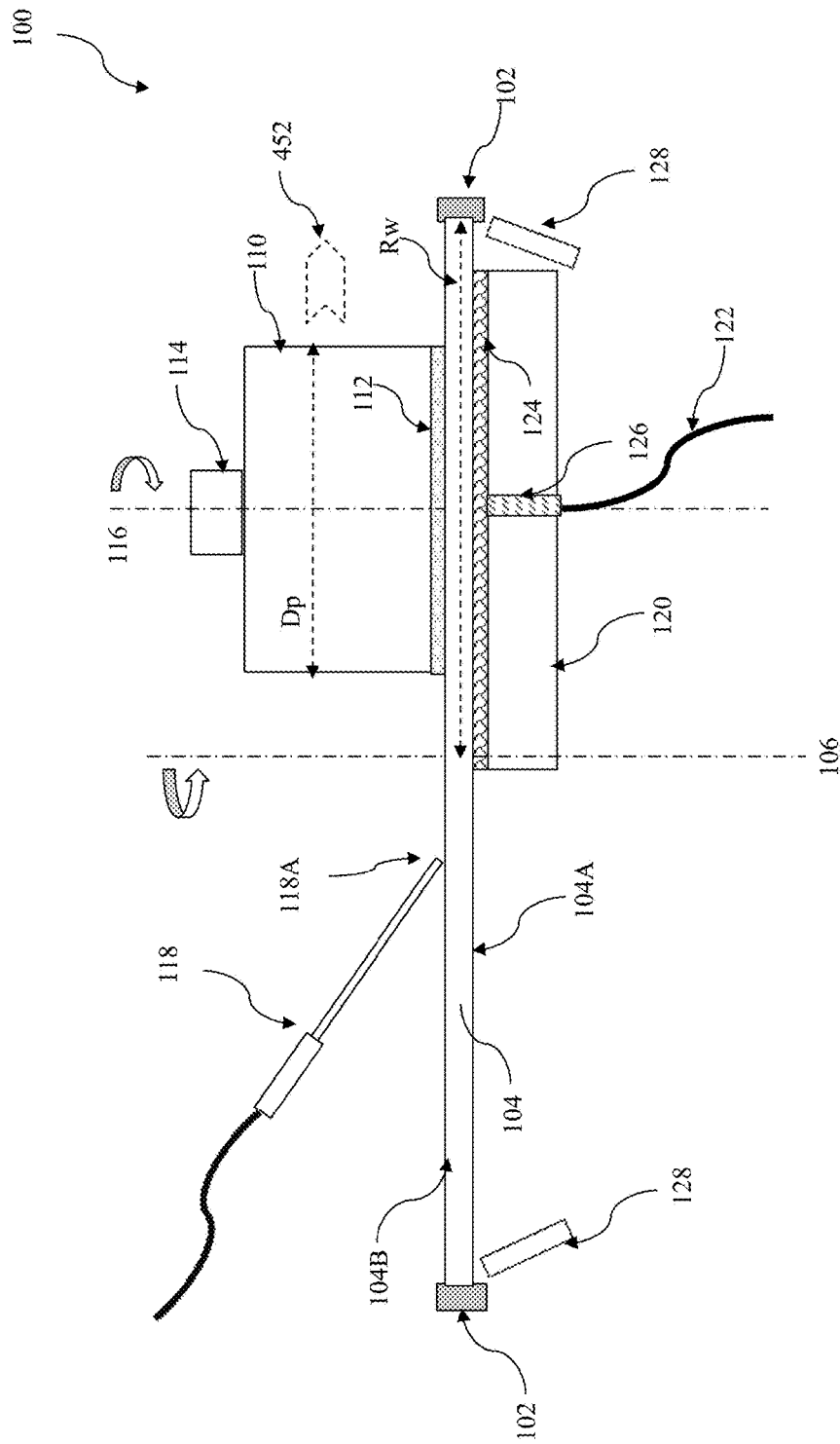
FIG. 5A is a schematic and sectional view of a polish module, in portion, constructed in accordance with some embodiments.

The polish module 100 is described above with reference to FIG. 1 and other figures. The polish module 100 may have other modifications, alternatives or a combination thereof. FIG. 5A illustrates a polish module 100 in a schematic and sectional view in accordance with some embodiments. The polish module 100 in FIG. 5A may be similar to the polish module 100 in FIG. 1 in some aspects and may be different in other aspects. For examples, the polish head 110 may have a different design, such as a smaller size. In some examples, the polish head 110 has a polish surface 112 with a diameter less than the radius Rw of the wafer 104. In this case, the polishing head 110 further includes a sweeping mechanism so that the polish head 110 is operable to move radially along the sweeping direction 452. The sweeping direction 452 is in the radial direction of the wafer 104 from the wafer center (axis 106) to the wafer edge. In one example, the mechanism 114 is designed to have both rotation function and sweeping function. During a polishing process, the polish head 110 rotates around the axis 116 and moves radially along the sweep direction 452. Additionally, the wafer rotates around the axis 106 during the polishing process. By the combination of wafer rotation, polish head rotation and polish head sweeping, the polish surface 112 is able to sweep radially across the wafer and cover the whole backside surface 104B of the wafer 104 during the polishing process. Especially, by adjusting the sweep dwell time, the polishing amount can be changed. Furthermore, the sweep dwell time can be varied locally according to the locations from the center to the edge of the wafer. Thus, the polishing variation from the center to the edge can be compensated to achieve a uniform polishing surface by adjusting the sweep dwell time.

Figure 5B:
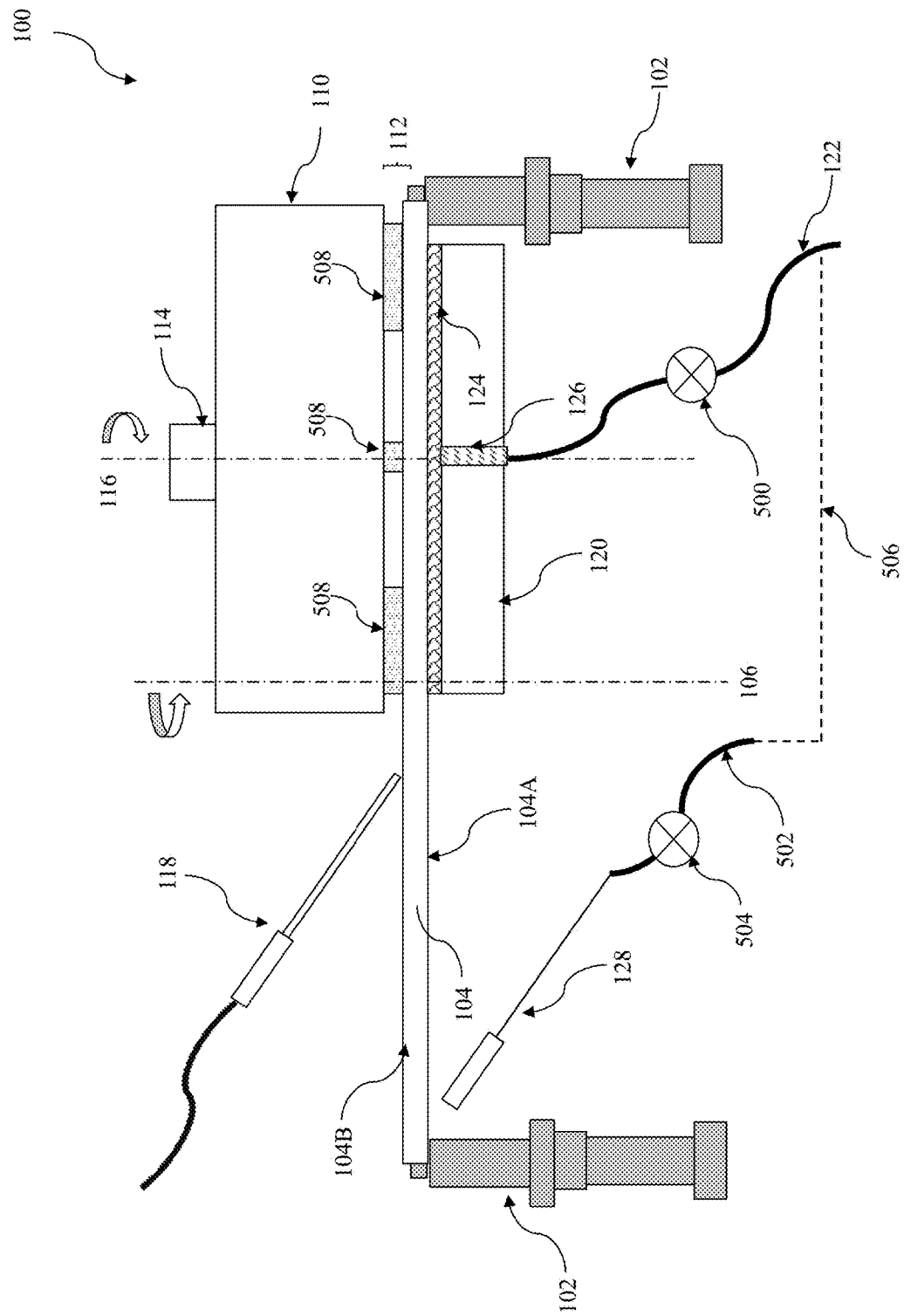
FIG. 5B is a schematic and sectional view of a polish module, in portion, constructed in accordance with some embodiments.

FIG. 5B illustrates a polish module 100 in a schematic and sectional view in accordance with some embodiments. The polish module 100 in FIG. 5B may be similar to the polish module 100 in FIG. 1 in some aspects and may be different in other aspects. For examples, the substrate stage 102 may have different design or using a suitable mechanism, such as clamping mechanism. In some examples, a gas valve 500 is configured between the gas source 122 and the air bearing unit 120 to control the pressure of the air bearing for optimized bearing effect. The pressure of the air bearing may be further self-adjusted through the bearing gap, as noted above. In some examples, the edge sealing unit 128 is an air edge sealing unit contacted to a gas supply 502, such as a nitrogen source to provide a compressed and high pressure nitrogen gas. In some examples, a second gas valve 504 is configured between the gas supply 502 and the edge sealing unit 128 to control the gas flow. In some examples, the edge sealing unit 128 may be connected to the gas source 122 through a gas transportation mechanism 506 and shares the same gas source with the air bearing unit 120. In some embodiments, the polish surface 112 may have different design. For examples, the polish surface 112 may include a tape with abrasive particles attached to the tape. The abrasive particles may have suitable size or size distribution for desired polishing effect and may include diamond or other suitable materials. In some examples, the polish surface 112 may include multiple rolls of abrasive tapes 508 configured for uniform and effective polishing.

Figure 6:
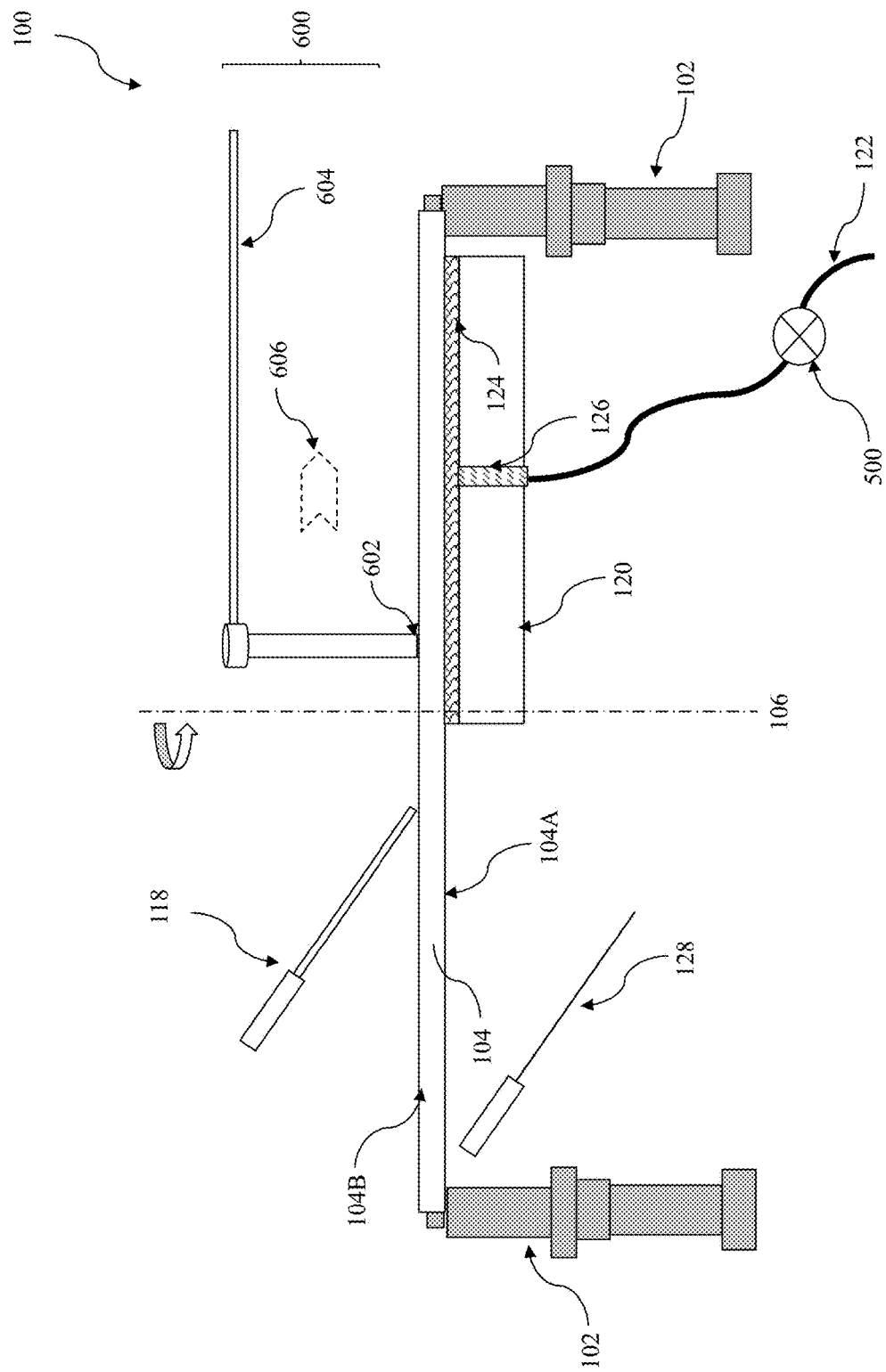
FIG. 6 is a schematic and sectional view of a polish module, in portion, constructed in accordance with some embodiments.

In the present embodiment, the polish module 100 further includes a pencil cleaning unit. The pencil cleaning unit and polish head 110 are operable to be placed on the backside surface 104B of the wafer for respective processes and be placed at an idle location. For example, when the polish head 110 is placed on the backside surface 104B of the wafer 104, the pencil cleaning unit is placed on the idle position. When the pencil cleaning unit is placed on the backside surface 104B of the wafer 104, the polish head 110 is replaced at the idle location. FIG. 6 is a schematic and sectional view of the polish module 100 in portion, in accordance with some embodiments. FIG. 6 illustrates the pencil cleaning unit 600 in the polish module 100 while the polish head 110 is not shown in FIG. 6 for simplicity. The pencil cleaning unit 600 is designed to clean the polished surface of the wafer 104 after the polishing process. In the present embodiment, the polished surface is the backside surface 104B of the wafer 104. The pencil cleaning unit 600 includes a sponge-like tip 602 that operable to clean the backside surface 104B of the wafer 104. The pencil cleaning unit 600 also includes a mechanism, such as a movable arm 604, that is connected to the sponge-like tip 602 and is able to control and manipulate the sponge-like tip 602 for cleaning. For example, the movable arm 604 can control the sponge-like tip 602 to move radially along the direction 606 from the center to the edges of the wafer 104 (or alternatively from the edges to the center) while the wafer 104 rotates around the axis 106 by the substrate stage 102. Thus, the sponge-like tip 602 is able to clean the backside surface 104B. In some embodiments, the cleaning process is collectively implemented by utilizing both the pencil cleaning unit 600 and the rinsing unit 118.

As noted above, the air bearing unit 120 and the edge sealing unit 128 are integrated with other components of the polish module 100 for securing and proper operations. The design and configuration further depend on a particular structure used for the edge sealing unit 128, such as the O-ring edge sealing unit 300 or the air edge sealing unit 200, further illustrated in FIGS. 7A and 7B, respectively.

Figure 7A:
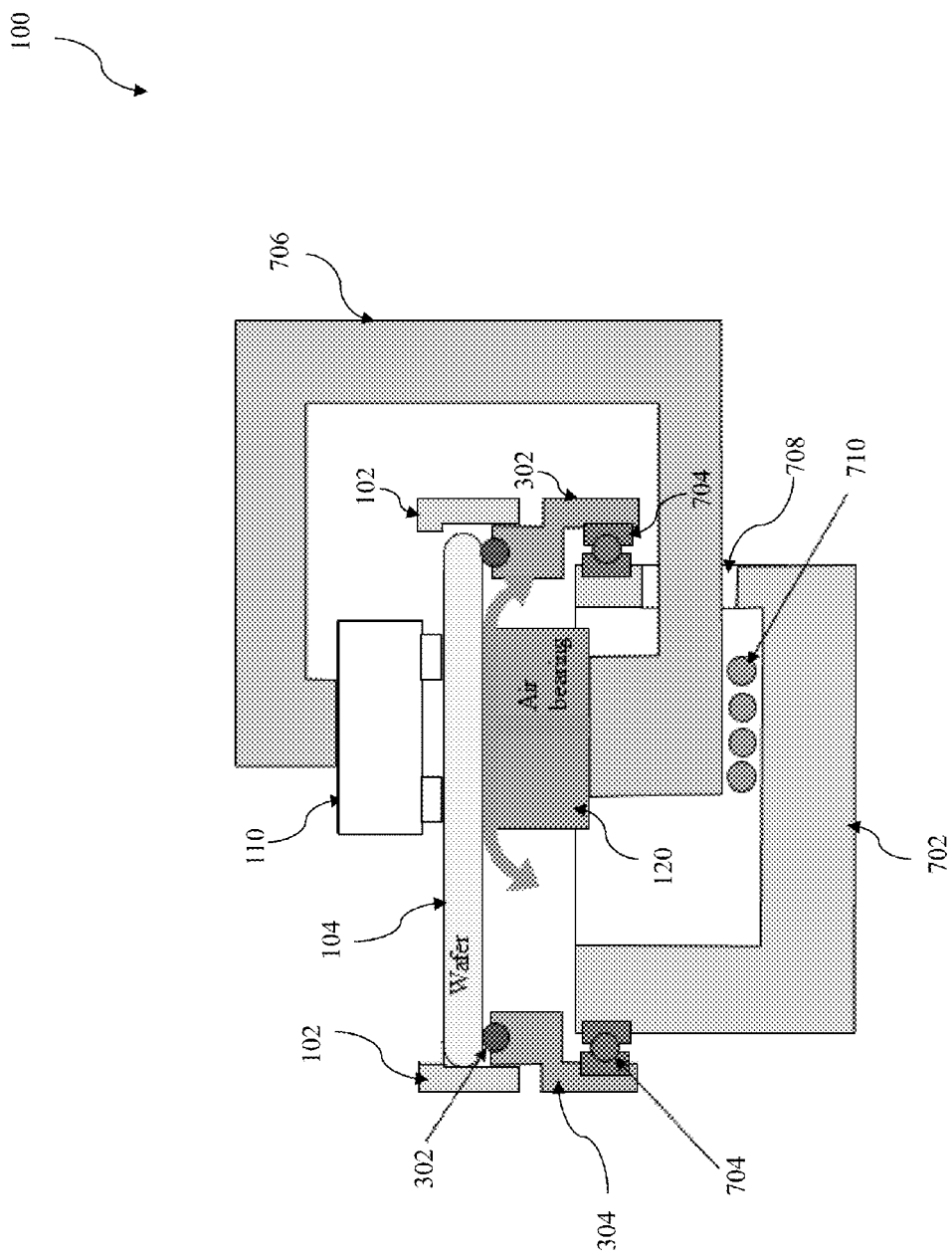
FIG. 7A is a schematic and sectional view of a polish module, in portion, constructed in accordance with some embodiments.

FIG. 7A illustrates a schematic and sectional view of the polish module 100, in portion, in accordance with some embodiments. In FIG. 7A, the polish module 100 includes an O-ring edge sealing unit 300 that utilizes an O-ring structure 302 and an edge curtain 304 extended from the O-ring to seal the front surface of the wafer 104. In some embodiments, the O-ring structure 302 is operable to approach, or further attach to the front surface 104A of wafer 104 for effective sealing. In this case, the O-ring edge sealing unit 300 (including the O-ring structure 302 and the edge curtain 304) is designed to be properly secured and to rotate along with the wafer 104 during various operations, such as polishing and cleaning. Particularly, the O-ring structure 302 and the edge curtain 304 are connected to a stationary fixture 702 through a rotation bearing connector 704. The stationary fixture 702 is a fixed component of the polish module 100 and is stationary during various operations. Thus, the O-ring edge sealing unit 300 is secured to the stationary fixture 702 and is still able to more along with the wafer 104. The wafer 104 is secured to the substrate stage 102 (such as by a wafer clamp structure) and moves along with the substrate stage 102.

Still referring to FIG. 7A, the air bearing unit 120 is integrated with the polish head 110 and is secured to the polish head 110. Therefore, the air bearing unit 120 is able to move with and to be aligned with the polish head 110 in order to provide a balance air pressure to the wafer 104 from the front surface 104A. For example, when the polish head 110 sweeps radially between the center and the edge of wafer 104, the air bearing unit 120 also moves radially with the polish head 110. Particularly, the air bearing unit 120 is integrated with the polish head 110 through a frame connector 706 that is connected to both the polish head 110 and the air bearing unit 120. The stationary fixture 702 is designed to have an opening 708 so that the frame connector 706 is attached to the air bearing unit 120 through the opening 708 and is able to move without interfering with the stationary fixture 702. In some embodiments, the polish module 100 further includes a linear bearing unit 710 configured between the stationary fixture 702 and the frame connector 706 so that the frame connector 706 is able to move freely relative to the stationary fixture 702.

Figure 7B:
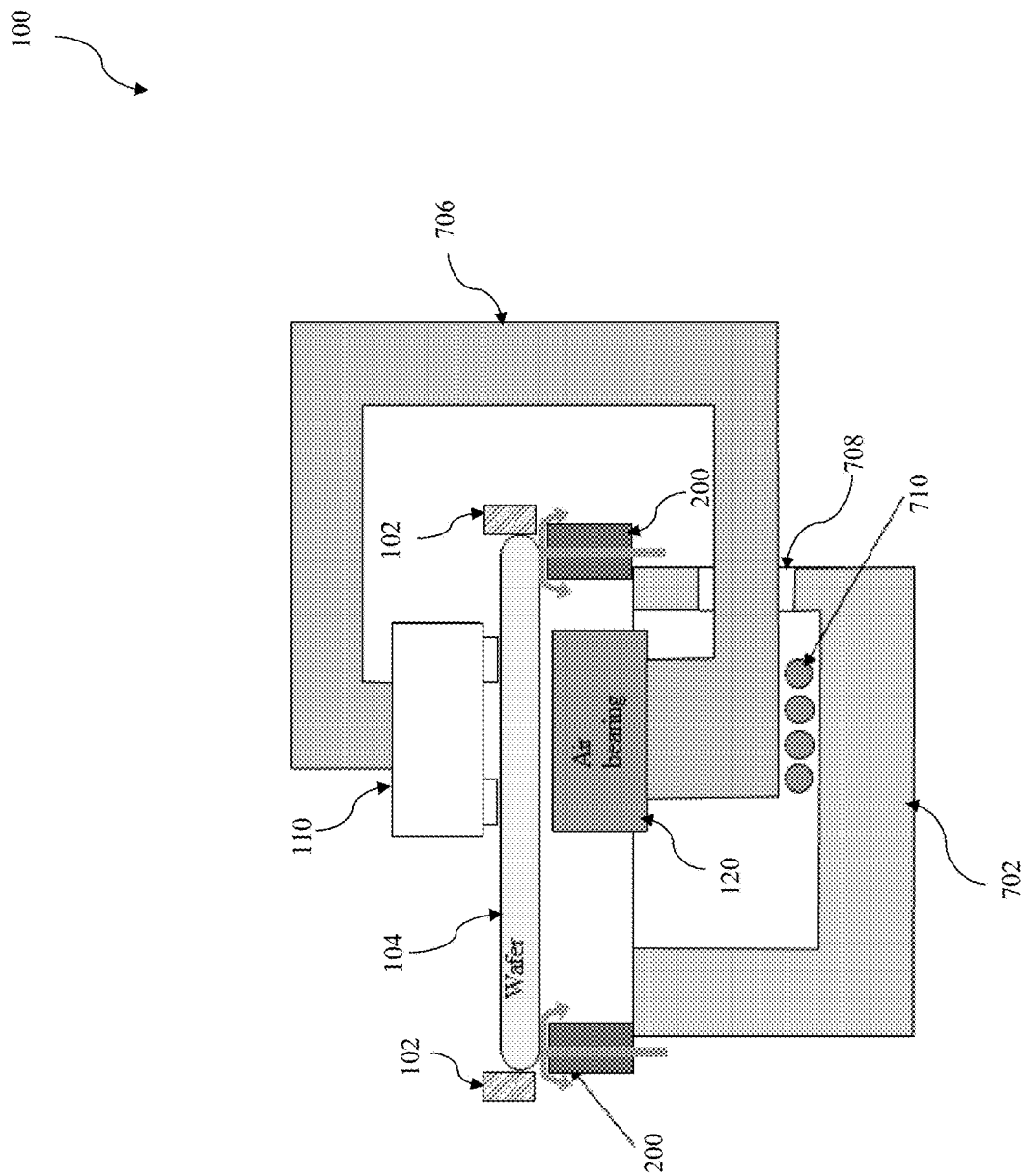
FIG. 7B is a schematic and sectional view of a polish module, in portion, constructed in accordance with some embodiments.

FIG. 7B illustrates a schematic and sectional view of the polish module 100, in portion, in accordance with some embodiments. In FIG. 7B, the polish module 100 includes an air edge sealing unit 200 that utilizes air sealing to the edge of wafer 104 so that the front surface 104A of thee wafer is not contaminated by chemicals during polishing and cleaning operations. In the present embodiment, the air edge sealing unit 200 is secured on and fixed to the stationary fixture 702 so that the air edge sealing unit 200 is not movable when the wafer 104 rotates during the polishing and cleaning operations.

Still referring to FIG. 7B, the air bearing unit 120 is integrated with the polish head 110 and is secured to the polish head 110, similar to the integration structure of the air bearing unit 120 and the polish head 110 in FIG. 7A. For example, the stationary fixture 702 is designed to have an opening 708 so that the frame connector 706 is attached to the air bearing unit 120 through the opening 708 and is able to move without interfering with the stationary fixture 702. In another example, the polish module 100 further includes a linear bearing unit 710 configured between the stationary fixture 702 and the frame connector 706 so that the frame connector 706 is able to move freely relative to the stationary fixture 702. In some examples, each of the stationary fixture 702 and the frame connector 706 may include a suitable material, such as stainless steel, metal or metal alloy. In some examples, each of the stationary fixture 702 and the frame connector 706 may be made by a proper method, such as molding or machining.

FIG. 8 is a block diagram of a polish system 800 in accordance with some embodiments. The polish system 800 is a cluster tool having one or more polish module 100 integrated in a processing chamber 802. In various embodiments, the polish system 800 includes a plurality of polish modules 100, such as 4, 6 or 8, properly configured and integrated. In the present example, 4 exemplary polish modules 100 are integrated together, as illustrated in FIG. 8.

The polish system 800 includes a load lock module 804 with one or more load lock units for loading wafers to or unloading the wafers from the polish system 800. In the present embodiments, the wafers are loaded and unloaded in batches, by using wafer containers, such as front opening unified pods (FOUPs).

The polish system 800 includes one or more robot 806 for handling wafers. The robot 806 is configured between the load lock module 804 and the processing chamber 802 in a way for proper wafer transferring between the polish modules 100 and the load lock module 804. For example, each wafer is transferred by the robot 806 from the load lock module to one of the polish modules 100 for a polishing process and thereafter is transferred back to the load lock unit module 804 by the robot 806. Since the disclosed polish system 800 is able to polish the backside surface with simplified procedure, each polish module 100 can polish, clean and dry the backside surface 104 of the wafer. Since the front surface 104A of the wafer 104 is protected by the air bearing unit 120 and the edge sealing unit 128, the cleaning and drying of the front surface 104A of the wafer 104 is eliminated. Thus the wafer 104 can be effectively polished, cleaned and dried by one of the polish module 100, the plurality of polish modules 100 work in parallel for polishing, cleaning and drying multiple wafers simultaneously. The polish system 800 may include other components, such as the chemical supply to the rinsing units 118 of the polish module 100. The polish system 800 may be configured differently. For example, the air bearing units 120 of the polish module 100 may share a same nitrogen source.

Figure 9:
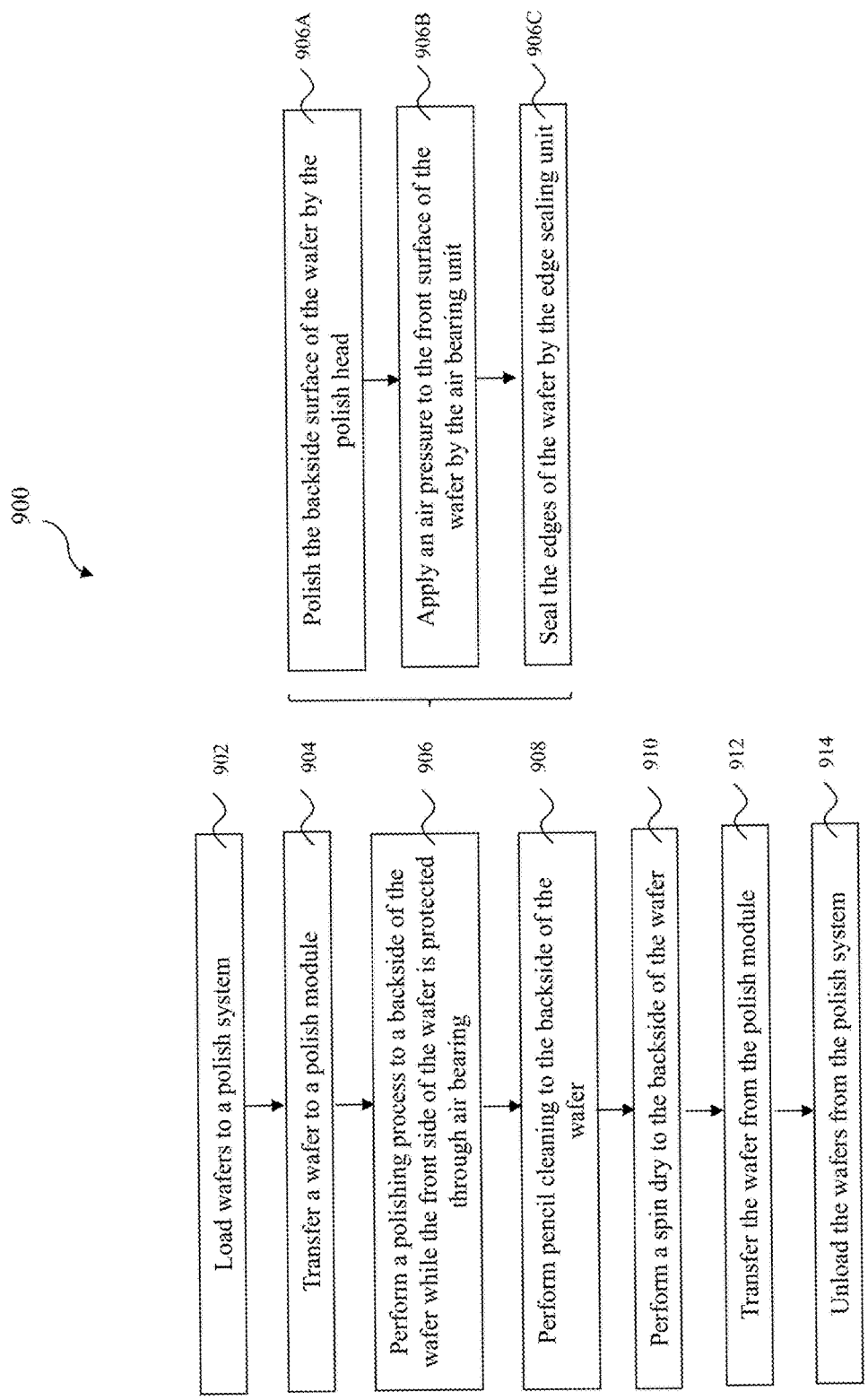
FIG. 9 is a flowchart of a method utilizing the polish system of FIG. 8, constructed in accordance with some embodiments.

FIG. 9 is a flowchart of a method 900 for polishing one or more semiconductor wafers 104, in accordance with some embodiments. The method 900 is implemented in the polish system 800 of FIG. 8. The method 900 is described with reference to FIGS. 8, 9 and other figures.

The method 900 includes an operation 902 to load one or more wafers to the polish system 800 through the load lock module 804. For example, wafers are in one or more batches, such as in FOUPs, are loaded to the polish system 800 by the load lock module 804.

The method 900 includes operation 904 to transfer a wafer from the load lock module 804 to one of the polish module 100 by the robot 806. For example, the robot 806 sequentially transfers 4 wafers to 4 polish modules 100, respectively. In other example, the polish system 800 may include two or more robots 806 to simultaneously transfer wafers to respective polish modules 100. Specifically, in the present embodiment, the wafer 104 is transferred to the substrate stage 102 of the corresponding polish module 100 in a configuration that the front surface 104A faces the air bearing unit 120, as illustrated in FIG. 1.

The method 900 proceeds to an operation 906 to perform a polishing process to the wafer 104 in one of the polish modules 100. The operation 906 and the following operations are described with one polish module and one wafer. However, as described above, the multiple wafers (such as 4 wafers) may be processed in multiple polish modules in parallel. In the present embodiment, the backside surface 104B of the wafer 104 is polished by the polish head 110 during the operation 906.

During the polishing process, various modules and units of the polish system 800 work collectively and synergistically. Accordingly, the operation 906 includes various sub-operations. Especially, the operation 906 includes a sub-operation 906A to polish the backside surface 104B of the wafer 104 by the polish head 110; an sub-operation 906B to provide an air pressure to the front surface 104A of the wafer 104 by the air bearing unit 120; and a sub-operation 906C to seal the edges of wafer 104 by the edge sealing unit 128.

The sub-operation 906A to polish the backside surface 104B of the wafer 104 may include various polish modes. In some embodiments, the sub-operation 906A includes simultaneously rotating the wafer 104 around the axis 106 and rotating the polish head 110 around the axis 116. In some other embodiments, the polish head 110 has a small size, such as one illustrated in FIG. 5A. In this case, the sub-operation 906A includes simultaneously rotating the wafer 104 around the axis 106, rotating the polish head 110 around the axis 116, and sweeping the polish head 110 radially.

The operation 906 may further include other sub-operations. In the present embodiments of the operation 906, the substrate stage 102 secures the wafer 104 and rotates the wafer around the axis 106 with a first rotation rate; the polish head 110 is placed and pressed onto the backside surface 104B of the wafer 104 and rotates around the axis 116; the rinsing unit 118 may be applied to provide a rinsing solution to the backside surface 104B of the wafer; the air bearing unit 120 provides the air bearing to the front surface 104A of the wafer; and the edge sealing unit 128 provides edge sealing to the edges of the wafer 104. In some embodiments, the first rotation rate ranges between 100 revolutions per minute (RPM) and 180 RPM. Furthermore, the gas to the air bearing unit 120 may be adjusted through the first valve 500 and the gas to the edge sealing unit 128 may be adjusted through the second valve 504. As an example for illustration, during the polishing process, the pressure to the backside surface 104B of the wafer 104 from the polish head 110 may be tuned through the polishing process, such as a first pressure during a first polishing phase and then a second pressure during a second polishing phase. The second pressure is less than the first pressure.

The method 900 proceeds to an operation 908 to perform a cleaning process to the backside surface 104B of the wafer 104 in the same polish module 100. In the present embodiment, the polish head 110 is replaced to an idle location and the pencil cleaning unit 600 is placed on the backside surface 104B of the wafer 104. During the cleaning process, various modules and units of the polish system 800 work collectively and synergistically. Especially, the substrate stage 102 secures the wafer 104 and rotates the wafer around the axis 106 with a second rotation rate; the pencil cleaning unit 600 is placed and applied onto the backside surface 104B of the wafer 104 and may move radially on the wafer 104; the rinsing unit 118 may be applied to provide a rinsing solution to the backside surface 104B of the wafer 104; the air bearing unit 120 provides the air bearing to the front surface 104A of the wafer; and the edge sealing unit 128 provides edge sealing to the edges of the wafer 104. In some embodiments, the second rotation rate is different from the first rotation rate, such as less than the first rotation rate. For examples, the second rotation rate may range between 50 RPM and 150 RPM. Furthermore, the gas to the air bearing unit 120 may be adjusted through the first valve 500 to a lower level that corresponds to the pressure from the sponge-like tip 602 of the pencil cleaning unit 600. In some examples, the rinsing unit 118 may deliver a different chemical solution for effective cleaning. In some examples for illustration, during the cleaning process, the sponge-like tip 602 of the pencil cleaning unit 600 may move from the center to the edges of the wafer 104.

The method 900 proceeds to an operation 910 to perform a drying process to the backside surface 104B of the wafer 104 in the same polish module 100. In the present embodiment, the drying process is a spin-drying process. The pencil cleaning unit 600 may be moved to an idle location. During the cleaning process, various modules and units of the polish system 800 work collectively and synergistically. Especially, the substrate stage 102 secures the wafer 104 and rotates the wafer around the axis 106 with a third rotation rate substantially greater than the first and second rotation rates; and the edge sealing unit 128 provides edge sealing to the edges of the wafer 104. In some examples, the air bearing unit 120 may provide the air bearing to the front surface 104A of the wafer. In some embodiments, the third rotation rate may range between 500 RPM and 1500 RPM.

Thus, the backside surface 104B of the wafer 104 is polished, cleaned and dried in the same polish module. The front surface 104A of the wafer is protected from the damage and contamination by the air bearing unit 120 and the edge sealing unit 128. Various cleaning and drying processes to the front surface 104A are eliminated.

After the wafer 104 has been polished, cleaned and dried, the method 900 includes an operation 912 to transfer the wafer 104 to the load lock module 804 by the robot 806. This operation is similar to the operation 904 but it is reversed. For example, the multiple wafers are transferred to the load lock module 804 from the polish modules 100, respectively.

The method 900 may further include an operation 914 to unload the wafers from the polish system 800 through the load lock module 804. The method 900 may include other operations, before, during or after the operations described above. For example, after the operation 912, the wafers may be transferred for lithography patterning process, such as photoresist coating and exposure. Since the flatness of the backside surface of a wafer is increased in addition to the enhanced flatness of the front surface of the wafer, the exposure process has improved quality.

The polish system 800 and the method 900 may further include other embodiments, or alternatives. For examples, even though the method 800 describes a procedure to polish the backside surface of a wafer for backside surface flatness, the polish system and the method utilizing the same may be used to polish the front surface of a wafer. In some embodiments, the method 900 may be used to thin down a wafer from the backside surface, for the applications, such as 3D packaging or micro-electromechanical systems (MEMS) packaging.

The present disclosure provides a polish system and a method utilizing the same. By utilizing the disclosed polish system, the backside surface of the wafer is polished, cleaned and dried in a same polish module. The front surface of the wafer is protected from the damage and contamination by the air bearing unit and the edge sealing unit.

The embodiments of the present disclosure offer advantages over existing art, though it is understood that other embodiments may offer different advantages, not all advantages are necessarily discussed herein, and that no particular advantage is required for all embodiments. Various advantages may present in some embodiments. By utilizing the disclosed polish system and the method, the front surface of the wafer is protected from the damage and contamination by the air bearing unit and the edge sealing unit. Various cleaning and drying processes to the front surface are eliminated. The manufacturing cost is reduced and the manufacturing throughput is increased.

Furthermore, the lithography process is benefited from the improved flatness of the wafer backside surface. When the integrated circuits progress to advanced technology nodes with small feature sizes and when a semiconductor substrate includes 3D devices, such as fin field effect transistors (FinFETs), both the front and backside surface profiles will impact the lithography patterning process and degrade the imaging resolution. The disclosed polish system and the method improve wafer backside surface flatness and improve the qualities of the lithography patterning processes.

Thus, the present disclosure provides a semiconductor fabrication apparatus in accordance with one embodiment. The apparatus includes a wafer stage that is operable to secure and rotate a wafer; a polish head configured to polish a backside surface of the wafer; an air bearing module configured to apply an air pressure to a front surface of the wafer; and an edge sealing unit configured to seal edges of the wafer.

The present disclosure provides a semiconductor fabrication system in accordance with some embodiments. The semiconductor fabrication system includes a load lock module to load and unload plurality of wafers; a plurality of polish modules; and a robot unit configured between the load lock and the plurality modules, wherein the robot unit is operable to transfer one of the wafers to one of the polish modules. Each of the polish modules further includes a wafer stage that is operable to secure a wafer and rotate the wafer; a polish head configured to polish a backside surface of the wafer; and an air bearing module that is operable to provide an air pressure to a front surface of the wafer.

The present disclosure provides a semiconductor fabrication method in accordance with some embodiments. The method includes polishing a backside surface of a wafer; applying an air pressure to a front surface of the wafer during the polishing of the backside surface of the wafer; and sealing edges of the wafer during the polishing of the backside surface of the wafer.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor fabrication apparatus, comprising:
   a wafer stage that is operable to secure and rotate a wafer;
   a polish head configured to polish a backside surface of the wafer;
   an air bearing module configured to apply an air pressure to a front surface of the wafer; and
   an edge sealing unit configured to seal edges of the wafer.

2. The semiconductor fabrication apparatus of claim 1, further comprising:
   a stationary fixture designed to secure the edge sealing unit and having an opening; and
   a frame connector that connects the air bearing unit and the polish head together through the opening.

3. The semiconductor fabrication apparatus of claim 2, wherein:
   the edge sealing unit includes an O-ring edge sealing unit to seal the edge of the wafer; and
   the O-ring edge sealing unit is secured to the stationary fixture through a rotation bearing unit configured such that the O-ring edge sealing unit is able to move with the wafer.

4. The semiconductor fabrication apparatus of claim 2, wherein the edge sealing unit includes an air edge sealing unit fixed to the stationary fixture.

5. The semiconductor fabrication apparatus of claim 1, wherein the air bearing module is connected to a nitrogen source to provide nitrogen bearing to the front surface of the wafer.

6. The semiconductor fabrication apparatus of claim 5, wherein the air bearing module further includes a bearing surface designed to deliver the nitrogen to a bearing gap between the front surface of the wafer and the bearing surface.

7. The semiconductor fabrication apparatus of claim 6, wherein the bearing surface includes a porous membrane.

8. The semiconductor fabrication apparatus of claim 1, wherein the polish head includes a mechanism to rotate the polish head around a center of the polish head.

9. The semiconductor fabrication apparatus of claim 8, wherein the polish head includes an abrasive surface designed to polish the backside surface of the wafer.

10. The semiconductor fabrication apparatus of claim 8, wherein the polish head includes a plurality of abrasive tape rolls configured to polish the backside surface of the wafer.

11. The semiconductor fabrication apparatus of claim 1, further comprising a rinsing unit that is operable to rinse the backside surface of the wafer.

12. The semiconductor fabrication apparatus of claim 1, further comprising a pencil cleaning unit that includes a sponge-like tip and is operable to clean the backside surface of the wafer.

13. A semiconductor fabrication system, comprising:
   a load lock module to load and unload a plurality of wafers;
   a plurality of polish modules, wherein each of the polish modules includes:
      a wafer stage that is operable to secure a wafer and rotate the wafer,
      a polish head configured to polish a backside surface of the wafer, and
      an air bearing module that is operable to provide an air pressure to a front surface of the wafer,
   a robot unit configured between the load lock module and the plurality of polish modules, wherein the robot unit is operable to transfer one of the wafers to one of the polish modules.

14. The semiconductor fabrication system of claim 13, wherein the each of the polish modules further includes an edge sealing unit configured to seal edges of the wafer, wherein the edge sealing unit is an air sealing unit or an O-ring structure.

15. The semiconductor fabrication apparatus of claim 13, wherein the each of the polish modules further includes:
   a stationary fixture designed to secure the edge sealing unit; and
   a frame connector connecting the air bearing unit and the polish head together through an opening of the frame connector.

16. The semiconductor fabrication system of claim 13, wherein:
   the polish head includes a plurality of abrasive tape rolls configured to polish the backside surface of the wafer; and
   the each of the polish modules further includes a pencil cleaning unit having a sponge tip, wherein the pencil cleaning unit is operable to clean the backside surface of the wafer.

17. A method, comprising:
   polishing a backside surface of a wafer;
   applying an air pressure to a front surface of the wafer during the polishing of the backside surface of the wafer; and
   sealing edges of the wafer during the polishing of the backside surface of the wafer.

18. The method of claim 17, wherein the sealing of the edges of the wafer includes applying nitrogen to air-seal the edges of the wafer or using an O-ring structure to seal the edges of the wafer.

19. The method of claim 17, further comprising:
   performing a pencil cleaning process to the backside surface of the wafer; and
   spin-drying the backside surface of the wafer, wherein:
   the polishing of the backside surface of the wafer includes rotating the wafer at a first rotation rate greater than zero,
   the performing of the pencil cleaning process to the backside surface of the wafer includes rotating the wafer at a second rotation rate greater than zero, and
   the spin-drying of the backside surface of the wafer includes rotating the wafer at a third rotation rate greater than the first and second rotation rates.

20. The method of claim 19, wherein the polishing of the backside surface of the wafer further includes rotating a polish head and sweeping the polish head radially simultaneously.

\* \* \* \* \*